(12) United States Patent
Rodriguez et al.

(10) Patent No.: US 9,761,538 B1
(45) Date of Patent: Sep. 12, 2017

(54) METHOD FOR MAKING A SHIELDED INTEGRATED CIRCUIT (IC) PACKAGE WITH AN ELECTRICALLY CONDUCTIVE POLYMER LAYER

(71) Applicant: STMICROELECTRONICS, INC, Calamba, Laguna (PH)

(72) Inventors: Rennier Rodriguez, Bulacan (PH); Frederick Arellano, Pulo Cabuyao Laguna (PH); Aiza Marie Agudon, Calamba (PH)

(73) Assignee: STMICROELECTRONICS, INC., Laguna (PH)

( * ) Notice: Subject to any disclaimer, the term of this patent is extended or adjusted under 35 U.S.C. 154(b) by 0 days.

(21) Appl. No.: 15/068,752

(22) Filed: Mar. 14, 2016

(51) Int. Cl.
| | | |
|---|---|---|
| H01L 21/78 | (2006.01) |
| H01L 23/552 | (2006.01) |
| H01L 21/48 | (2006.01) |
| H01L 21/56 | (2006.01) |
| H01L 23/29 | (2006.01) |
| H01L 23/31 | (2006.01) |

(52) U.S. Cl.
CPC ........ *H01L 23/552* (2013.01); *H01L 21/4814* (2013.01); *H01L 21/561* (2013.01); *H01L 21/78* (2013.01); *H01L 23/29* (2013.01); *H01L 23/3135* (2013.01)

(58) Field of Classification Search
CPC ..... H01L 23/552; H01L 21/561; H01L 23/29; H01L 21/4814; H01L 23/3135; H01L 21/78
See application file for complete search history.

(56) References Cited

U.S. PATENT DOCUMENTS 7,342,303 B1    3/2008 Berry et al.
8,368,185 B2 *  2/2013 Lee ...................... H01L 21/561
                                                257/659

* cited by examiner

*Primary Examiner* — Kyoung Lee
(74) *Attorney, Agent, or Firm* — Slater Matsil, LLP

(57) ABSTRACT

A method for making shielded integrated circuit (IC) packages includes providing spaced apart IC dies carried by a substrate and covered by a common encapsulating material, and cutting through the common encapsulating material between adjacent IC dies to define spaced apart IC packages carried by the substrate. An electrically conductive layer is positioned over the spaced apart IC packages and fills spaces between adjacent IC packages. The method further includes cutting through the electrically conductive layer between adjacent IC packages and through the substrate to form the shielded IC packages.

30 Claims, 5 Drawing Sheets

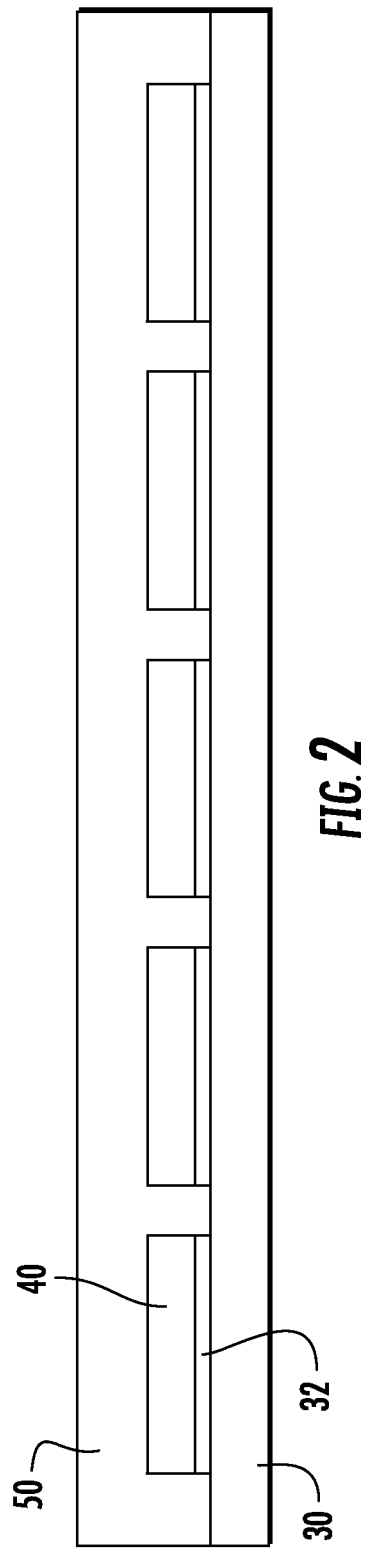
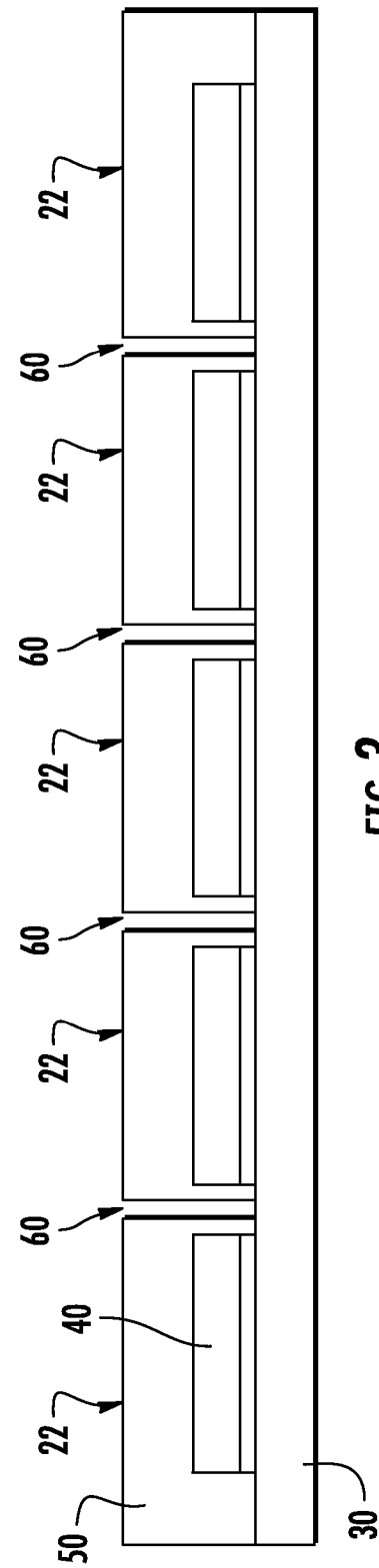

METHOD FOR MAKING A SHIELDED INTEGRATED CIRCUIT (IC) PACKAGE WITH AN ELECTRICALLY CONDUCTIVE POLYMER LAYER

FIELD OF THE INVENTION

The present invention refers to the field of integrated circuit (IC) packages, and more particularly, to electrically shielding an IC package.

BACKGROUND OF THE INVENTION

There exists a general need in wireless communications devices for certain integrated circuit (IC) packages to be isolated from electromagnetic interference (EMI) in order to maintain proper device performance. The electromagnetic interference may be received from, or transmitted to, the environment.

One approach for shielding an IC package from electromagnetic interference is to cover the IC package with a grounded metal enclosure typically called a can. However, this approach may be costly and lacks design flexibility. In addition, the metal can adds weight and adds significant size to the IC package footprint.

Another approach is to use a physical vapor deposition (PVD) process that deposits in a vacuum chamber a conductive layer on an upper surface of the IC package. Sputtering is a type of PVD that involves ejecting material from a target that is a source onto a substrate (such as an IC package) in a vacuum chamber. However, this approach is expensive and it is difficult to control a thickness of the coating layer. Consequently, there is a need for electrically shielding an IC package in a relatively straightforward manner.

SUMMARY OF THE INVENTION

A method for making a plurality of integrated circuit (IC) packages includes providing a plurality of spaced apart IC dies carried by a substrate and covered by a common encapsulating material, and cutting through the common encapsulating material between adjacent IC dies to define a plurality of spaced apart IC packages carried by the substrate. The substrate may be exposed after cutting the encapsulating material between adjacent IC dies.

An electrically conductive polymer layer may be positioned over the plurality of spaced apart IC packages and over the spaces between adjacent IC packages, with the electrically conductive polymer layer being a solid material carried by a film. Pressure and heat may be applied to the electrically conductive polymer layer so that the solid material transforms to a soft material so as to flow over the plurality of spaced apart IC packages and filling the spaces between adjacent IC packages.

The electrically conductive polymer layer may be cooled from the soft material back to the solid material providing an electrically conductive layer. The film may then be removed from the electrically conductive layer. The method further includes cutting through the electrically conductive layer between adjacent IC packages and through the substrate to form the plurality of shielded IC packages. The electrically conductive layer may be on an upper surface and sidewalls of each IC package.

The electrically conductive polymer layer may comprise a non-conductive polymer with conductive fillers mixed therein. The non-conductive polymer may be thermosetting.

A thickness of the electrically conductive layer may be within a range of 5-15 microns, for example. Use of the electrically conductive polymer layer advantageously allows the thickness of the electrically conductive layer to be controlled so that a uniform thickness is provided. Use of the electrically conductive polymer layer also advantageously provides a shielded IC package in a relatively straightforward manner.

BRIEF DESCRIPTION OF THE DRAWINGS

FIG. 2 is a cross-sectional view of spaced apart IC dies carried by a substrate and covered by a common encapsulating material.

FIG. 3 is a cross-sectional view of spaced apart IC dies, the substrate and the common encapsulating material illustrated in FIG. 2 after cutting the common encapsulating material between adjacent IC dies to define spaced apart IC packages.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
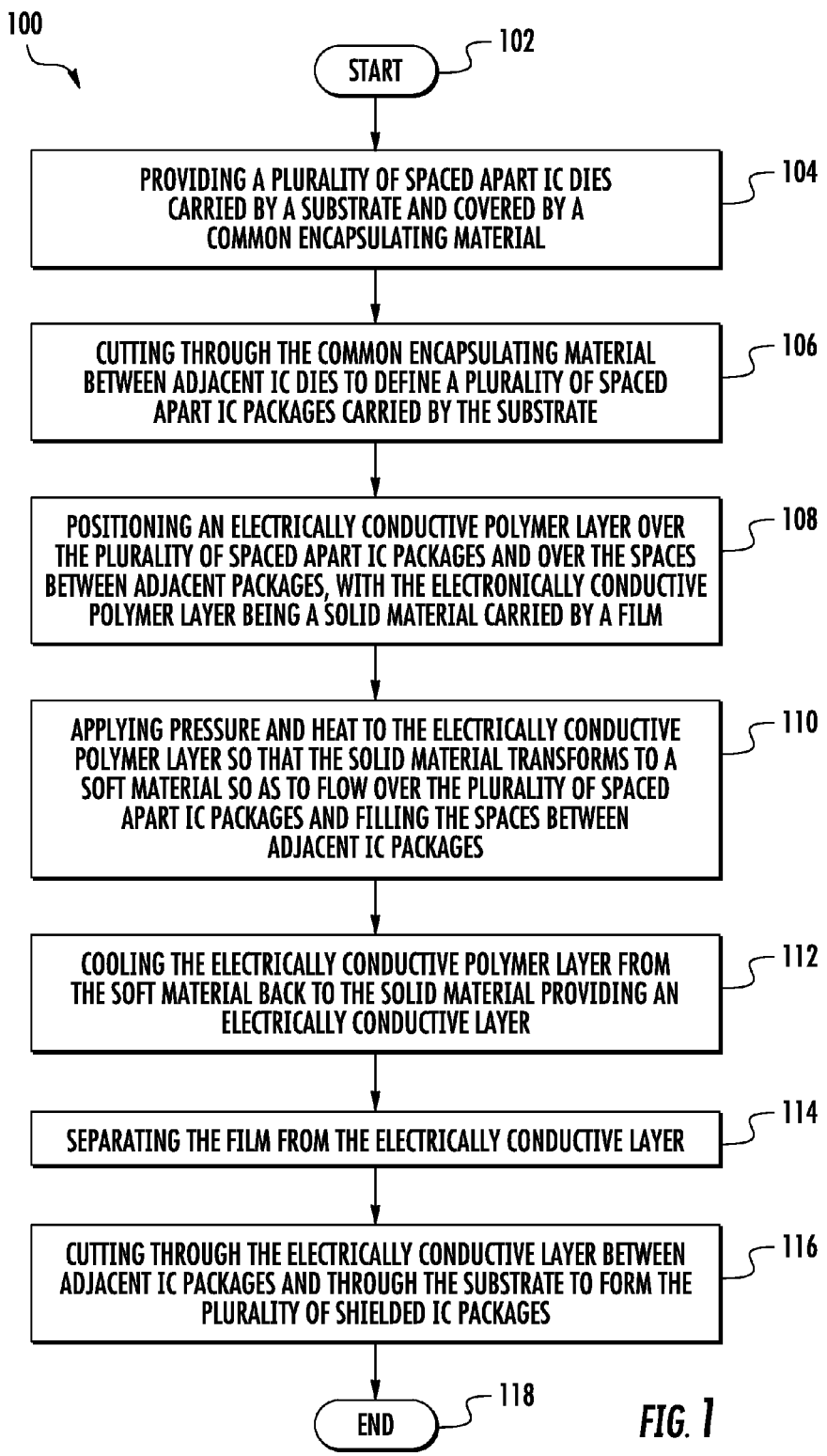
FIG. 1 is flowchart for making a plurality of shielded integrated circuit (IC) packages in accordance with an embodiment of the present invention.

A method for making a plurality of shielded integrated circuit (IC) packages 24 will now be discussed in reference to the flowchart 100 in FIG. 1 and to the process steps in FIGS. 2-6. Starting from Block 102, a plurality of spaced apart IC dies 40 carried by a substrate 30 and covered by a common encapsulating material 50 is provided at Block 104 and as illustrated in FIG. 2.

Each IC die 40 is secured to the substrate 30 by an adhesive layer 32. Each IC die 40 may be electrically coupled to the substrate 30 through the use of wire bonds, for example. Alternatively, a flip chip may be used.

The method further includes at Block 106 cutting through the common encapsulating material 50 between adjacent IC dies 40 to define a plurality of spaced apart IC packages 22 carried by the substrate 30, as illustrated in FIG. 3. A gap 60 is now between adjacent IC packages 22. The substrate 30 is exposed after cutting the encapsulating material 50 between adjacent IC dies 40.

Figure 4:
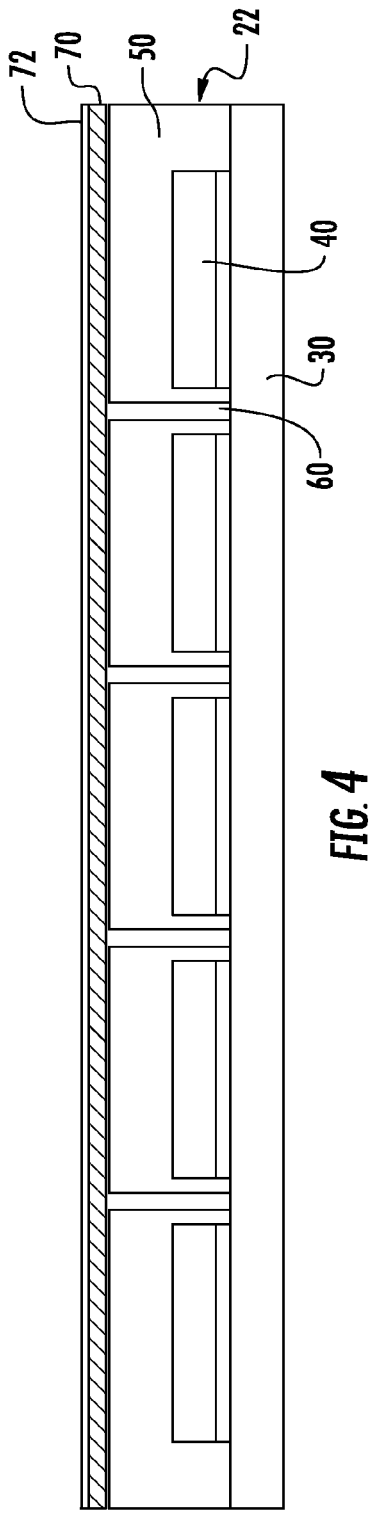
FIG. 4 is a cross-sectional view of an electrically conductive polymer layer positioned over the spaced apart IC packages and over the spaces between adjacent IC dies illustrated in FIG. 3.
Figure 5:
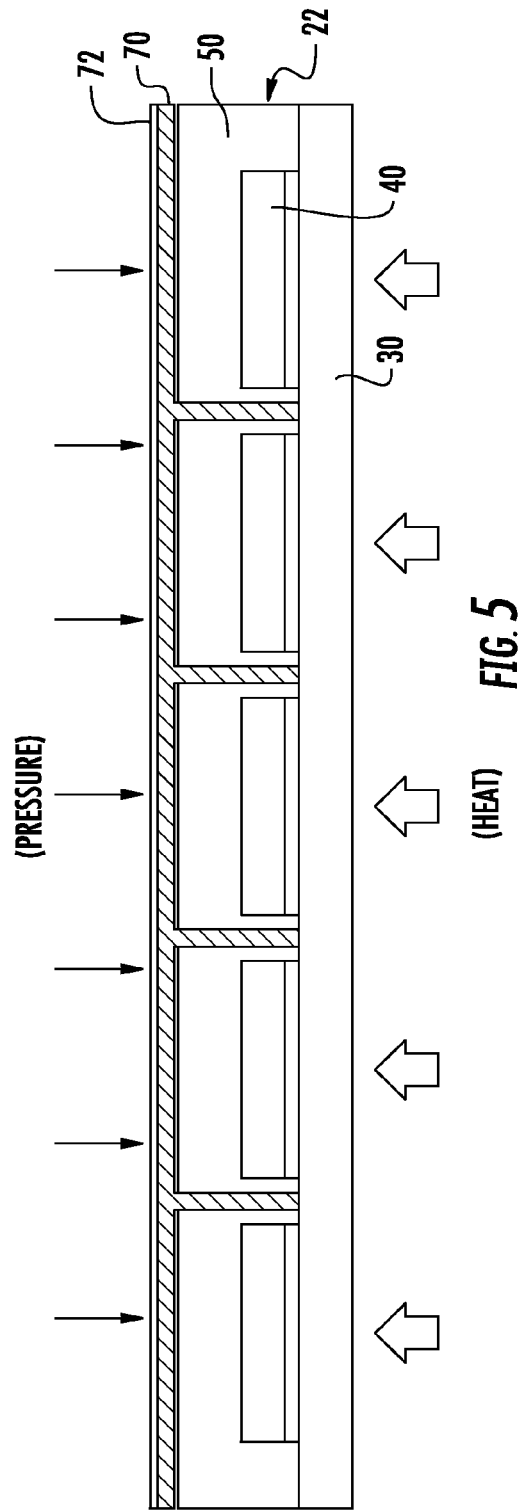
FIG. 5 is a cross-sectional view of the electrically conductive polymer layer illustrated in FIG. 4 with pressure and heat being applied to provide an electrically conductive layer over the spaced apart IC packages and filling the spaces between adjacent IC packages.

An electrically conductive polymer layer 70 is positioned over the plurality of spaced apart IC packages 22 and over the spaces 60 between spaced apart IC packages 22 at Block 108 and as illustrated in FIG. 4. The electrically conductive polymer layer 70 is a solid material carried by a film 72.

The electrically conductive polymer layer 70 comprises a non-conductive polymer with conductive fillers mixed therein. The non-conductive polymer is thermosetting. The conductive fillers, for example, may include aluminum, copper, chromium, stannum, gold, silver, nickel or any combination thereof. Nonetheless, the conductive fillers are not limited to these metal materials.

Pressure and heat are simultaneously applied at Block 110 to the electrically conductive polymer layer 70. The pressure and heat causes the electrically conductive polymer layer 70, which is a solid material, to transform to a soft material so as to flow over the plurality of spaced apart IC packages 22 and filling the spaces 60 between adjacent IC packages. The soft material is a gel like material that can easily spread through small intersections and interfaces.

The heat applied to the electrically conductive polymer layer 70 is within a range of 100-150° C., for example. The pressure applied to the electrically conductive polymer layer 70 is within a range of 200-400 kPa, for example.

The electrically conductive polymer layer 70 is cooled at Block 112 from the soft material back to the solid material. The cooling may be to room temperature or lower, for example. This provides an electrically conductive layer 80 over the plurality of IC packages 22 and the spaces 60 between adjacent IC packages. The film 72 is then removed or separated from the electrically conductive layer 80 at Block 114. Since the substrate 30 is exposed between adjacent IC packages, this allows the electrically conductive layer 80 to be grounded.

Figure 6:
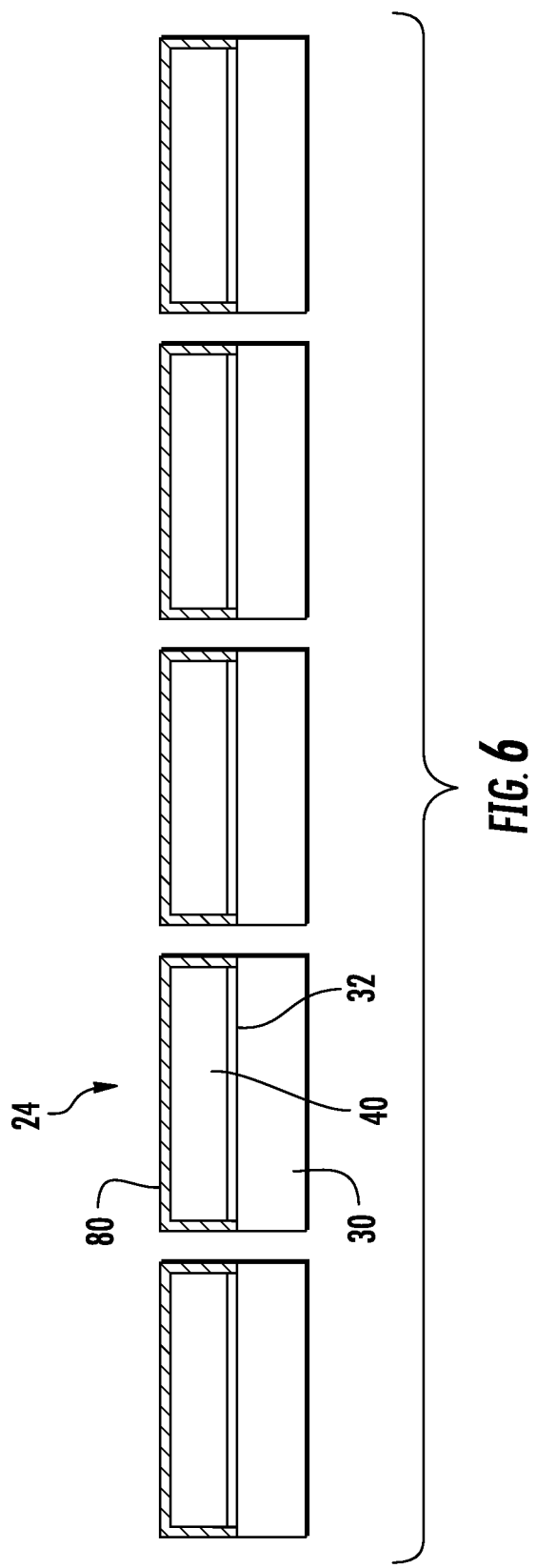
FIG. 6 is a cross-sectional view of the shield IC packages illustrated in FIG. 5 after cutting through the electrically conductive layer between the adjacent IC packages illustrated in FIG. 5.

The method further includes at Block 116 cutting through the electrically conductive layer 80 between adjacent IC packages 22 and through the substrate 30 to form the plurality of shielded IC packages 24. As best illustrated in FIG. 6, the electrically conductive layer 80 is on an upper surface and sidewalls of each IC package 22.

A thickness of the electrically conductive layer 80 may be within a range of 5-15 microns, for example. Use of the electrically conductive polymer layer 70 advantageously allows the thickness of the electrically conductive layer 80 to be controlled so that a uniform thickness is provided. Use of the electrically conductive polymer layer 70 also advantageously provides a shielded IC package 24 in a relatively straightforward manner.

Figure 7:
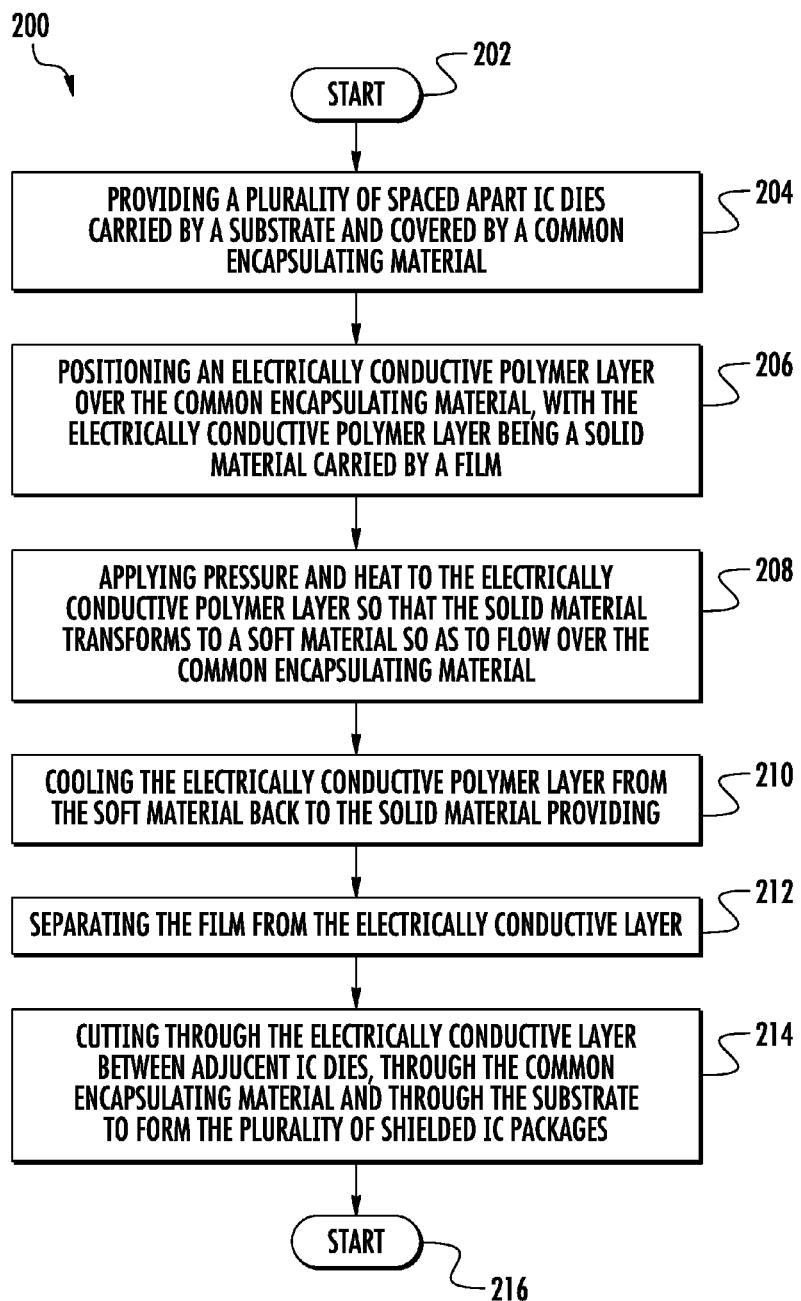
FIG. 7 is flowchart for making a plurality of shielded integrated circuit (IC) packages in accordance with another embodiment of the present invention.

As an option, if the sides of the IC packages 22 do not need to be shielded, then the step of cutting through the common encapsulating material 50 between adjacent IC dies 40 is not performed. Reference is now directed to the flowchart 200 illustrated in FIG. 7. From the start (Block 202), the method comprises providing a plurality of spaced apart IC dies 40 carried by a substrate 30 and covered by a common encapsulating material 50 at Block 204.

An electrically conductive polymer layer 70 is positioned over the common encapsulating material 50 at Block 206, with the electrically conductive polymer layer being a solid material carried by a film 72. Pressure and heat are applied to the electrically conductive polymer layer 70 so that the solid material transforms to a soft material so as to flow over the common encapsulating material 50 at Block 208.

The electrically conductive polymer layer 70 is cooled from the soft material back to the solid material at Block 210. The film 72 is separated from the electrically conductive layer 70 at Block 212. The method further comprises cutting through the electrically conductive layer 70 between adjacent IC dies 40, through the common encapsulating material 50 and through the substrate 30 to form the plurality of shielded IC packages at Block 214. The method ends at Block 216.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a plurality of shielded integrated circuit (IC) packages comprising:
   providing a plurality of spaced apart IC dies carried by a substrate and covered by a common encapsulating material;
   cutting through the common encapsulating material between adjacent IC dies to define a plurality of spaced apart IC packages carried by the substrate;
   positioning an electrically conductive layer over the plurality of spaced apart IC packages and completely filling spaces between adjacent IC packages, wherein the completely filling the spaces between the adjacent IC packages is performed by a deposition process without filling the spaces followed by a drive-in process; and
   cutting through the electrically conductive layer between adjacent IC packages and through the substrate to form the plurality of shielded IC packages.

2. The method according to claim 1, wherein positioning the electrically conductive layer comprises:
   positioning an electrically conductive polymer layer over the plurality of spaced apart IC packages and over the spaces between adjacent IC packages, with the electrically conductive polymer layer being a solid material carried by a film;
   applying pressure and heat to the electrically conductive polymer layer so that the solid material transforms to a soft material so as to flow over the plurality of spaced apart IC packages and filling the spaces between adjacent IC packages; and
   cooling the electrically conductive polymer layer from the soft material back to the solid material providing the electrically conductive layer.

3. The method according to claim 2, further comprising separating the film from the electrically conductive layer.

4. The method according to claim 1, wherein the substrate is exposed after cutting the encapsulating material between adjacent IC dies.

5. The method according to claim 1, wherein the electrically conductive layer is on an upper surface and sidewalls of each IC package.

6. The method according to claim 2, wherein the electrically conductive polymer layer comprises a non-conductive polymer with conductive fillers mixed therein.

7. The method according to claim 6, wherein the non-conductive polymer is thermosetting.

8. The method according to claim 2, wherein the heat applied to the electrically conductive polymer layer is within a range of 100-150° C.

9. The method according to claim 2, wherein the pressure applied to the electrically conductive polymer layer is within a range of 200-400 kPa.

10. The method according to claim 1, wherein a thickness of the electrically conductive layer is within a range of 5-15 microns.

11. The method according to claim 1, wherein the substrate is exposed after cutting the encapsulating material between adjacent IC dies, and wherein the electrically conductive layer is on an upper surface and sidewalls of each IC package.

12. A method for making a plurality of shielded integrated circuit (IC) packages comprising:
provinding a plurality of spaced apart IC dies carried by a substrate and covered by a common encapsulating material;
forming openings in the common encapsulating material between adjacent IC dies;
forming an electrically conductive layer over the common encapsulating material and the openings;
after forming the electrically conductive layer, transporting material from the electrically conductive layer to fill the opening; and
cutting through the electrically conductive layer between adjacent ones of the plurality of spaced apart IC dies and through the substrate to form the plurality of shielded IC packages.

13. The method according to claim 11, wherein positioning the electrically conductive layer comprises:
positioning an electrically conductive polymer layer over the plurality of spaced apart IC packages and over the spaces between adjacent IC packages, with the electrically conductive polymer layer being a solid material carried by a film;
applying pressure and heat to the electrically conductive polymer layer so that the solid material transforms to a soft material so as to flow over the plurality of spaced apart IC packages and filling the spaces between adjacent IC packages; and
cooling the electrically conductive polymer layer from the soft material back to the solid material providing the electrically conductive layer.

14. The method according to claim 13, further comprising separating the film from the electrically conductive layer.

15. The method according to claim 13, wherein the electrically conductive polymer layer comprises a non-conductive polymer with conductive fillers mixed therein.

16. The method according to claim 15, wherein the non-conductive polymer is thermosetting.

17. The method according to claim 13, wherein the heat applied to the electrically conductive polymer layer is within a range of 100-150° C.; and the pressure applied to the electrically conductive polymer layer is within a range of 200-400 kPa.

18. The method according to claim 11, wherein a thickness of the electrically conductive layer is within a range of 5-15 microns.

19. A method for making a plurality of shielded integrated circuit (IC) packages comprising:
providing a plurality of spaced apart IC dies carried by a substrate and covered by a common encapsulating material;
cutting through the common encapsulating material between adjacent IC dies to define a plurality of spaced apart IC packages carried by the substrate;
positioning an electrically conductive polymer layer over the plurality of spaced apart IC packages and over the spaces between adjacent IC packages, with the electrically conductive polymer layer being a solid material carried by a film;
applying pressure and heat to the electrically conductive polymer layer so that the solid material transforms to a soft material so as to flow over the plurality of spaced apart IC packages and filling the spaces between adjacent IC packages;
cooling the electrically conductive polymer layer from the soft material back to the solid material providing an electrically conductive layer; and
cutting through the electrically conductive layer between adjacent IC packages and through the substrate to form the plurality of shielded IC packages.

20. The method according to claim 19, further comprising separating the film from the electrically conductive layer.

21. The method according to claim 19, wherein the substrate is exposed after cutting the encapsulating material between adjacent IC dies.

22. The method according to claim 19, wherein the electrically conductive layer is on an upper surface and sidewalls of each IC package.

23. The method according to claim 19, wherein the electrically conductive polymer layer comprises a non-conductive polymer with conductive fillers mixed therein.

24. The method according to claim 23, wherein the non-conductive polymer is thermosetting.

25. The method according to claim 19, wherein the heat applied to the electrically conductive polymer layer is within a range of 100-150° C., and the pressure applied to the electrically conductive polymer layer is within a range of 200-400 kPa.

26. A method for making a plurality of shielded integrated circuit (IC) packages comprising:
providing a plurality of spaced apart IC dies carried by a substrate and covered by a common encapsulating material;
positioning an electrically conductive polymer layer over the common encapsulating material, with the electrically conductive polymer layer being a solid material carried by a film;
applying pressure and heat to the electrically conductive polymer layer so that the solid material transforms to a soft material so as to flow over the common encapsulating material;
cooling the electrically conductive polymer layer from the soft material back to the solid material providing; and
cutting through the electrically conductive layer between adjacent IC dies, through the common encapsulating material and through the substrate to form the plurality of shielded IC packages.

27. The method according to claim 26, further comprising separating the film from the electrically conductive layer.

28. The method according to claim 26, wherein the electrically conductive polymer layer comprises a non-conductive polymer with conductive fillers mixed therein.

29. The method according to claim 28, wherein the non-conductive polymer is thermosetting.

30. The method according to claim 26, wherein the heat applied to the electrically conductive polymer layer is within a range of 100-150° C., and wherein the pressure applied to the electrically conductive polymer layer is within a range of 200-400 kPa.

* * * * *